United States Patent [19]
Kiser

[11] Patent Number: 4,621,241
[45] Date of Patent: Nov. 4, 1986

[54] WIDE RANGE ELECTRONIC OSCILLATOR

[75] Inventor: Joseph H. Kiser, Aurora, Colo.

[73] Assignee: Vari-L Company, Inc., Denver, Colo.

[21] Appl. No.: 742,194

[22] Filed: Jun. 7, 1985

[51] Int. Cl.$^4$ .............................................. H03B 5/00
[52] U.S. Cl. ................................ 331/117 R; 331/167; 331/175
[58] Field of Search ............. 331/105, 117 R, 117 FE, 331/167, 175; 455/121

[56] References Cited

U.S. PATENT DOCUMENTS

| | | | |
|---|---|---|---|
| 1,624,537 | 4/1927 | Colpitts | 455/121 |
| 2,225,897 | 12/1940 | Bell | 331/170 |
| 2,756,334 | 7/1956 | Blum | 331/95 |
| 3,675,109 | 7/1972 | Skoog | 331/117 R X |
| 3,813,615 | 5/1974 | Okazaki | 331/117 R X |
| 4,267,522 | 5/1981 | Periot | 331/117 R X |
| 4,360,790 | 11/1982 | Heise | 331/117 R X |
| 4,536,724 | 10/1985 | Hasegawa et al. | 331/117 R X |

*Primary Examiner*—Eugene R. LaRoche
*Assistant Examiner*—Robert J. Pascal
*Attorney, Agent, or Firm*—Fields, Lewis, Pittenger & Rost

[57] ABSTRACT

An oscillator disclosed has a resonant tank circuit inclusive of an inductor (L1), a capacitor (C1), a capacitor (C3) and a capacitor (C4) connected in series with one another. A signal amplifier (A) is connected in a feedback loop which includes capacitor (C3). An additional impedance (C5) is connected between the feedback output of the amplifier and the feedback signal dividing capacitors (C3) and (C4). This additional impedance (C5) improves tuning range, tuning linearity, phase noise performance, and provides a very flat power output at ultra high frequencies.

29 Claims, 9 Drawing Figures

Fig_1

Fig_2

Fig_3

Fig_4

Fig_5

Fig_6

Fig_7

Fig_9

Fig_8

[4,621,241]

WIDE RANGE ELECTRONIC OSCILLATOR

TECHNICAL FIELD

This invention relates generally to electronic oscillators and more particularly to improvements in electronic oscillators of the Colpitts and/or Clapp type.

BACKGROUND ART

The Colpitts and Clapp oscillators are well known for having good properties in the communications field. However, at ultra high frequencies (above about 500 MHz) the tuning range, the tuning linearity, power output flatness, and noise performance become greatly degraded. The current state of the art has been to accept a limited tuning range and then use multiple oscillators to cover wide bands and to use filtered and amplified harmonics of lower frequency oscillators to achieve acceptable power flatness and phase noise performance.

The Colpitts oscillator is described in U.S. Pat. No. 1,624,537. Bell U.S. Pat. No. 2,225,897 discloses a parallel resonant tuned circuit between the grid and plate of a vacuum tube and a capacitor between the grid and one side of the tuned circuit but does not have an impedance in the feedback loop to control the phase shift. Blum U.S. Pat. No. 2,756,334 discloses a parallel resonant tuned circuit between the grid and plate of a vacuum tube and a capacitor between the grid and one side of the tank circuit but, like Bell, has no way to control the phase shift in the feedback loop for the tank circuit.

DISCLOSURE OF INVENTION

In accordance with the present invention there is disclosed an oscillator having a resonant tank circuit, and a signal amplifier in a feedback loop which includes an impedance not present in the Colpitts or Clapp oscillators. This added impedance is connected between the feedback output of the amplifier and two feedback signal dividing capacitors in the resonant tank circuit. Another impedance is connected between the feedback output of the amplifier and ground. This circuit arrangement has been found to improve the tuning range, tuning linearity, and phase noise performance, as well as providing a very flat power output at ultra high frequencies (above about 500 MHz).

Modifications of the tank circuit, alternatives for the added impedance, the use of transmission line returns, and variations in the power output from the circuit are also disclosed.

BRIEF DESCRIPTION OF DRAWINGS

The details of this invention will be described in connection with the accompanying drawings, in which.

DETAILED DESCRIPTION

Figure 1:
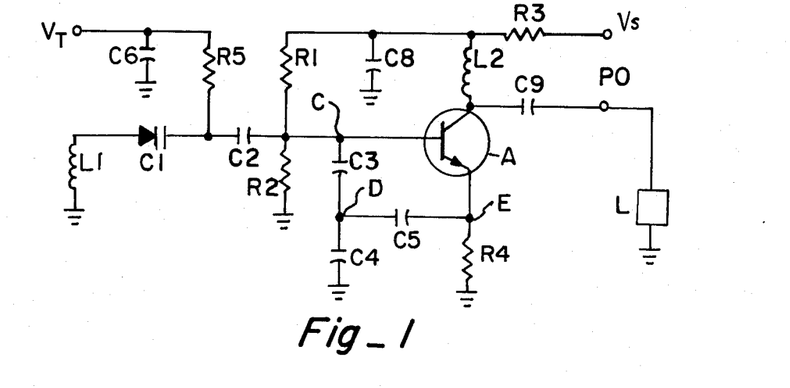
FIG. 1 is a schematic circuit diagram of an oscillator embodying features of the present invention.

Referring now to FIG. 1, there is shown an oscillator which includes a series resonant tuned tank circuit comprised of a main resonating inductor L1, a main tuning capacitor C1, shown as a varactor diode, a DC blocking capacitor C2, and feedback signal divider capacitors C3 and C4 connected in series. Capacitor C2 is not essential when C1 is a varactor diode but its use, connected as shown, is preferred. The side of the inductor L1 opposite its connection to capacitor C1 is shown connected to ground. The side of the divider capacitor C4 opposite its connection to capacitor C3 is shown connected to ground.

Inductor L1, which serves as the inductance means for the tank circuit, may be a variable inductor used to change the resonant frequency of the tank circuit. In this instance capacitor C1 would be a fixed value and preferably there would be no C2. The inductance means may also be a tuned cavity or crystal resonator. A crystal resonator would provide similar results except for the wider tuning range. However, the tuning range would be wide as compared with other crystal oscillators.

A DC voltage tuning input terminal VT is connected through a resistor R5 to tuning capacitor C1 to bias capacitor C1. More specifically, terminal VT supplies a positive tuning voltage at the cathode electrode with respect to the anode electrode of varactor diode C1. Resistor R5 is of a high value so as not to load the Q of the tank circuit. Resistor R5 may be an RF choke, a high impedance active device such as a transistor, or another network presenting a high RF impedance and a controlled DC resistance.

An RF bypass capacitor C6 is connected to input terminal VT and to ground to provide a low pass filter and thereby short out any RF signals. Capacitor C6 is a low reactance at minimum oscillator frequencies and a high reactance at maximum anticipated modulation frequencies.

The feedback loop for sustaining the oscillations in the tank circuit includes feedback signal dividing capacitor C3, an amplifier A, and an impedance in the form of a capacitor C5 connected between capacitors C3 and C4 at point D and the feedback output of the amplifier A at point E. Amplifier A as shown is an active device and specifically is an NPN transistor having the base and emitter electrodes connected in the feedback loop. Other active devices such as a FET or a vacuum tube may be used in place of a transistor. The prior art Colpitts oscillator has a direct connection or short where capacitor C5 is connected which results in a less desirable performance, as is discussed more fully hereinafter.

A feedback output impedance in the form of a resistor R4 is shown connected between the transistor emitter which is the feedback output of the amplifier, designated point E, and ground. Resistor R4 may be replaced with a choke, an output transformer, a filter or other network which looks like a high impedance at RF frequencies, and a controlled bias impedance to DC.

A DC voltage supply terminal VS is connected through a resistor R3 and an inductor L2 to the collector electrode of the transistor to supply a DC feed voltage thereto. A resistor R1 is connected to inductor L2 and to the base of the transistor to connect resistor R1 and inductor L2 between the base and collector electrodes of the transistor. Resistor R2 is connected to the base of the transistor and to ground. In this way resistors R1 and R2 are selected to provide the proper DC bias for the transistor and are selected to have a sufficiently large value so as not to degrade the Q of the tuned circuit. Resistors R1 and R2 may be replaced with other networks such as chokes or may be absent as required to provide the proper bias conditions for the transistor.

The power output is shown as being taken from the collector of the transistor. An AC output coupling and impedance matching arrangement is connected to the collector of the transistor and to a power output terminal PO which includes a capacitor C9 between the collector and power output terminal PO, an inductor L2 coupled to the collector, and an RF bypass capacitor C8 connected to the inductor L2, resistor R1 and resistor R3 and ground to provide an RF ground.

The output coupling and impedance matching can be accomplished in a number of ways which include changing L2 to a choke, resistor, filter, or other network which matches the active device to the desired output load. A load L is shown connected to the PO terminal. It is understood that the output power can be taken from other points in the circuit, as is discussed more fully hereinafter.

In the operation of the above described oscillator the LC resonant tank circuit oscillates at a frequency $$F = \frac{1}{2\pi} \sqrt{L \times C \text{ total}}.$$

C is the total capacitance in the tuned circuit. A portion of the feedback output of the amplifier A is applied in phase to the tank circuit and to the input of amplifier A to sustain oscillations.

In order not to reduce the effective value of C1, and thereby reduce tuning range, C2 should be much greater in value than C1. Values of C2 equal to ten to twenty times greater than a maximum value of C1 are typical. Capacitor C2 could be replaced by a conductor in applications where capacitor C1 is a mechanical DC isolated capacitor itself or, conversely, C1 is a fixed DC isolated value and inductor L1 is varied to change the resonant frequency of the oscillator.

Capacitor C3 functions to provide a return path for the resonant circuit energy from point C to point D and provides a feedback path for feedback energy developed by the transistor from point D to point C.

The value of C3 must be chosen in conjunction with the rest of the tuned circuit capacitors to provide the proper voltage to ground which is the point C to ground tap point on the tuned circuit to insure that the transistor is commutated through a sufficient dynamic range to develop enough feedback voltage, at point E to ground, to sustain the criteria for oscillations over the entire intended tuning range of the oscillator. Values of C3 equal to two to ten times the value of capacitor C1 are typical.

Capacitor C4, like capacitor C3, forms a return path for the resonant circuit from point D to ground. The value of C4 must be chosen in conjunction with the rest of the tuned circuit capacitors to provide the proper voltage to ground, which is the point C to ground tap point on the tuned circuit, to insure that the transistor is commutated through enough dynamic range to develop sufficient feedback voltage, at point E to ground, to sustain the criteria for oscillations over the entire intended tuning range of the oscillator. Values of C4 equal to two to ten times the value of capacitor C1 are typical.

Capacitor C4 also functions as a part of the return path for energy generated at point E to ground. In this sense, it functions as an RF bypass and has a primary effect on transistor gain over the tuning range. Capacitor C4, along with capacitor C3, sets the tap point D to ground voltage on the tuned circuit and controls the amount of feedback voltage applied to point C from point D generated by the transistor at point E by its commutation through its dynamic range. The tuning range for the oscillator may be approximated by (a) neglecting all stray and interelectrode capacitances of the transistor, (b) neglecting all stray series resistances, inductances and capacitances, (c) neglecting all stray shunt circuit capacitances between elements and to ground.

$C2 \cong 20 \times C1 \text{ max}$ $C3 \cong 5 \times C1 \text{ max}$ $C4 \cong 5 \times C1 \text{ max}$ The expression for CT max (C total) in the series tuned circuit would calculate out to:

$CT \text{ max} \cong 0.69 \times C1 \text{ max}$

Similarly, for values of C1 maximum $<<$ C2, C3, C4 i.e., large capacitor tuning ratios)

$CT \text{ minimum} = C1 \text{ minimum}.$

With modern tuning capacitors, electrically or mechanically variable, ranges of C maximum to C minimum of 15:1 to 20:1 are available. The frequency of the oscillator is proportional to $\sqrt{C}$. The total possible frequency tuning range with a capacitor with a tuning ratio of C maximum to C minimum = 15 is given by the ratio:

$$\text{Frequency tuning} = \sqrt{\frac{.69 \times C1}{\frac{C1 \text{ max}}{15}} \text{ max}}$$

$$= \sqrt{10.35}$$

$$= 3.21:1$$

In the Colpitts oscillator without C5, when C3 and C4 are selected to provide a wide tuning ratio, as demonstrated above, i.e., 2–10×C1 maximum, the capacitance to ground is found to be too large at point E. That is, when C3, C4 are selected for wide tuning ranges in the Colpitts oscillator, the oscillator output tends to be very nonflat, and oscillations typically cease over the upper half of the tuned band. If C3 and C4 are made smaller in the Colpitts oscillator, oscillations are maintained with the result that the tuning range is typically reduced to $$\frac{F_{Maximum}}{F_{Minimum}} << 2:1$$

The root cause for this condition is threefold: At very high frequencies the intercomponent inductances and active device interelectrode capacitances form parasitic paths or resonances. These may occur in band and cause conventional oscillator circuits to fail, typically at the upper end of the tuning band, thus limiting available tuning range. For example, in the Colpitts oscillator, collector to emitter capacitance in series with C4 can series resonate with stray interconnecting inductances to effectively RF short the transistor collector to ground and cause oscillations to cease.

In a like manner, the base to emitter capacitance in series with C4 can series resonate with stray interconnecting inductances to effectively short the transistor input to ground.

Similarly, in the Colpitts oscillator capacitor C3 would be connected directly between the base and the emitter, and a resonant current through interconnecting inductances can flow in circular fashion through the transistor base to emitter capacitance and back around through C3. This condition causes the transistor input to appear as a high impedance circuit and little power can be transmitted from the tuned circuit into this mismatch to commutate the transistor to achieve oscillations. All three conditions above of spurious resonances have been isolated and observed in the Colpitts oscillator to cause oscillations to cease and/or output power to vary widely over the band.

In addition, the ability of these parasitic resonances to cause undesired circuit operation is not simply traceable to pure shorting or open conditions. For example, parasitic resonances, well out of the oscillator intended tuning band, are seen to adversely affect proper operation. This condition results from disadvantageous phase shifts applied to the normal voltages and currents flowing in the transistor circuit. This is due to the transfer phase characteristics of the parasitic resonant circuits. For example, a positive voltage applied to the transistor base at point C is assumed to produce a corresponding voltage at point E minus a small base to emitter voltage drop in the transistor. This emitter voltage should be in phase with applied base voltage to produce proper transistor power amplification and feedback action.

As seen in the three parasitic resonance examples above, the voltage developed at point E may experience a phase shift due to the parasitic LRC circuits and thus not be applied to the feedback path in the proper phase to cause positive feedback. Hence, it will not sustain the desired regenerative buildup of oscillations.

The main tuned circuit by definition allows the current flow and voltage to be precisely in phase only near the $$F = \frac{1}{2\pi} \sqrt{L \times C_{total}}$$

oscillation frequency. Since the transistor base currents and voltages are applied in phase to the base only at the normal frequency of resonance, then the voltage and current developed at point E (the emitter) must remain of equal phases in order that feedback voltage from point E to the base via the dividing capacitors C3 and C4 is itself in phase with the original base input signal and, hence, positive feedback.

Since the emitter circuit forms a part of a parasitic tuned circuit at an entirely different (higher) frequency, the voltage and current at the desired resonance frequency are now of differing phase and, when applied to point C through the capacitor C3, do not constitute a positive feedback signal at the proper resonant frequency within the bandwidth of the tuned circuit, and oscillations cease, as previously outlined.

The present invention overcomes the above shortcomings of the Colpitts oscillator by introduction of an additional impedance in the path between point E and the feedback divider capacitors at point D. In the circuit of the present invention capacitors C3 and C4 are selected to optimize tuning range (as large as possible) consistent with proper impedance match to the input of the transistor, independently of their effect of causing troublesome parasitic resonance or parasitic phase shift effects on the emitter and feedback voltages and currents, as earlier discussed.

The reactance network represented by capacitor C5 from point E to point D is selected to yield proper gain of the transistor, feedback amplitude and phase shift characteristics to the feedback energy independently of the values of C3 and C4 previously optimized as outlined. Typically, values of $$C5 = \frac{C4}{4} \text{ to } C5 = C4$$

have been used to cause a circuit that would not operate properly over more than a 30% tuning range to operate with flat output over a 3:1 tuned frequency range. The parasitic series resonance return paths to ground now see:

$$C_{Return} = \frac{C5 \, C4}{C5 + C4}$$

instead of $C_{Return} = C4$ in the Colpitts oscillator.

If $C5 = \frac{1}{2} C4$, then $$C_{Return} = \frac{\left(\frac{C4}{2}\right) C4}{\frac{C4}{2} + C4}$$

$$C_{Return} = \frac{C4}{3}$$

This is to say that the troublesome parasitic series resonances and/or phase shifts have been moved substantially higher in frequency (reduced phase shift at the oscillator frequency) corresponding to a ground return capacitance, which is now typically one-third of a typical original value in the standard Colpitts circuit.

Similarly, since in a typical Colpitts circuit C4=C3, the circulating resonance path from emitter to base through C3 is likewise seen to be moved up in frequency (well out of band) corresponding to a circulating return emitter to base capacitance reduced to one-third of the Colpitts oscillator value.

In like manner, the troublesome emitter circuit phase shifts associated with the large original values of C3 and C4, in conjunction with other circuit strays, are seen to be substantially reduced. This allows sustained oscillations within the circuit at much higher frequencies and thereby yields much wider tuning ranges.

The use of the additional network between points E and D in the present circuit produces further benefits as follows:

(1) The emitter DC return point E to ground is always some finite impedance (R4, a resistance in FIG. 1) and appears directly across C4 to ground in the Colpitts oscillator and thereby appears by definition across a portion of the tuned circuit capacitance C4. This constitutes a load upon the tuned tank circuit, which tends to lower its Q and reduce overall stability associated with a desirable high circuit Q. The introduction of capacitor C5 causes resistor R to be an undesired load on the tank circuit through capacitor C5 so as to isolate resistor R4 from the tuned tank circuit by virtue of its series reactance and raise the circuit loaded Q and thereby improves the stability of the oscillations in the tank circuit.

(2) A portion of the power produced by commutation of the transistor at point E is fed back to the transistor in phase through capacitor C3 to the transistor base to cause oscillations. A necessary consequence of circuit and transistor action is the undesired production of noise spikes which, upon being fed back, tend to modulate the transistor and the voltage tuned capacitor to cause phase modulation of the desired oscillating frequency. Typically, the loaded Q of the tuned circuit is not sufficiently high to completely filter this noise which appears along with the useful output power as both AM noise and FM (phase) noise.

In the present invention, noise components near the oscillating frequency are reduced in amplitude in the feedback path by virtue of the voltage drop across C5 from point E to point D. By virtue of the voltage divider, consisting of capacitors C5 and C4 to ground, C4 was chosen, as above discussed, to have a larger value than allowed in the Colpitts oscillator. This improves the reduction in noise components. Improvements in near-in phase noise of six to ten decibels have been measured in a circuit according to the present invention, compared to the Colpitts oscillator.

In addition, low frequency noise components, either generated within the circuit or present from the external power supply, are filtered to ground by being partially dissipated in resistor R4 by virtue of capacitor C5 in conjunction with resistor R4, providing a low pass filtering action. Low frequency noise energy, which appears at point E, is presented with a very high impedance to the feedback path through capacitor C5 and a much lower impedance to ground through resistor R4. Hence, low frequency noise is effectively filtered in the circuit of the present invention from the feedback path by a greater amount than in the Colpitts oscillator where the low frequency noise is presented directly to point D in the tuned circuit.

Figure 2:
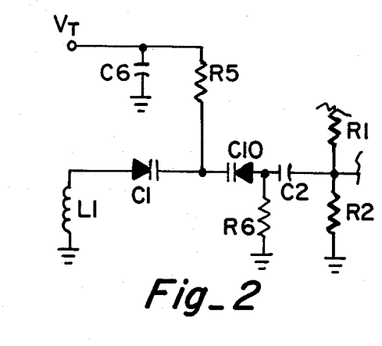
FIG. 2 is a schematic circuit diagram of a modification of the oscillator shown in FIG. 1.

The modified oscillator shown in FIG. 2 has another varactor diode C10 connected in series with varactor diode C1 with the cathodes of the two connected together. A DC return resistor R6 is connected to the anode of varactor diode C10. This circuit tends to reduce the harmonic generation in the varactor diodes.

Figure 3:
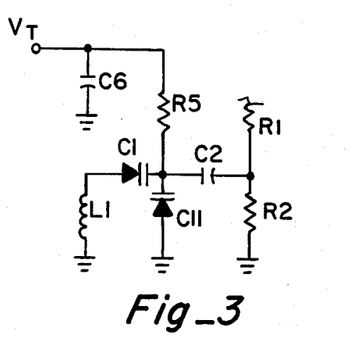
FIG. 3 is a schematic circuit diagram of another modification of the oscillator shown in FIG. 1.

Referring to FIG. 3, a varactor diode C11 is connected in series with varactor diode C1 with the cathodes of the two connected together. The anode of varactor diode C11 is connected to ground. At the low end of the band the tuned circuit functions in a parallel resonant mode, C1 together with C11 being the main tuning capacitors and C2 simply coupling energy to the transistor. At the high end of the band C11 is much less than the capacitance of the rest of the circuit and the circuit transitions to a series resonant circuit where C1 is now the main resonant capacitor and the overall oscillator tuning range is increased.

Figure 4:
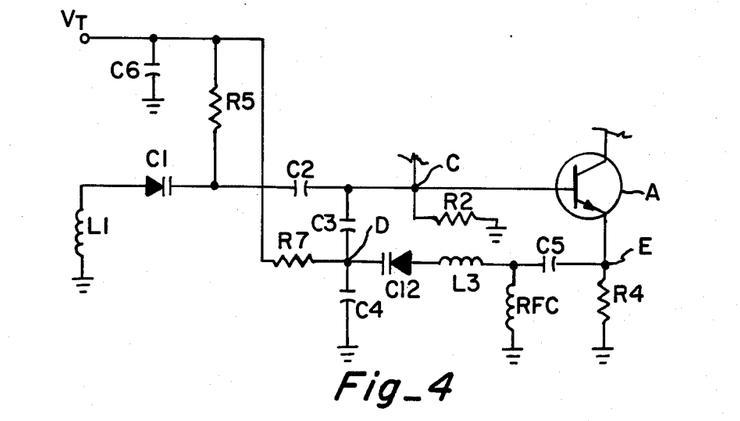
FIG. 4 is a schematic circuit diagram of yet another modification of the oscillator shown in FIG. 1.

The modified circuit shown in FIG. 4 includes a tuned series resonant circuit that is tuned and ganged to the resonant tank circuit. This circuit consists of an inductor L3 and a varactor diode C12 connected between capacitor C5 and point D, together with a choke RFC connected between capacitor C5 and ground. An additional resistor R7 is added between point D and terminal VT. In this circuit the value of resistor R5 is typically equal to the value of resistor R7 and the capacitance of capacitor C1 is equal to the capacitance of capacitor C12.

This circuit is ganged to and adjusted to track the resonant frequency of the tuned circuit. This added tuned circuit filters the feedback signal, that is, it only allows the transistor to have maximum gain at the fundamental oscillator frequency and thereby functions as a tuned bandpass feedback filter. In this way harmonics and out-of-band noise are effectively attenuated in the oscillator output relative to the desired oscillator frequency. Since the current and voltage are in phase in a series resonant circuit at resonance, this tuned circuit, when properly alined, has no effect on the transfer phase of the circuit from point D to point E.

The stability of this circuit relative to phase shifts associated with pushing, pulling, and AM/FM noise modulation is improved by virtue of the increased phase shift character of the tandem tuned circuit as well as the filtering action realized in the feedback circuit.

Figure 5:
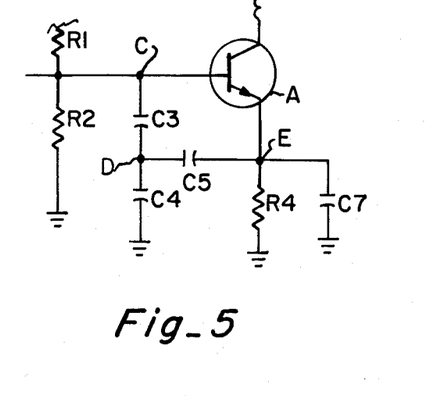
FIG. 5 is a schematic circuit diagram of a further modification of the oscillator shown in FIG. 1.

It will be noted that a capacitor may be connected across resistor R4, as is described in FIG. 5, but this is optional for the circuit of FIG. 4. The added capacitor would improve the Q of the main tuned circuit by effectively shunting the value of R4 with a relatively lossless element.

The modified circuit shown in FIG. 5 has a capacitor C7 connected across resistor R4. This addition of C7 allows the adjustment of the transistor gain independently from the adjustment of the feedback impedance. Further, C7 changes the Q loading on the tuned circuit to the extent that there are improved stability and a higher performance that come with an associated higher Q value for the tuned circuit. Improvements in a loaded Q of a ratio of 2:1 have been realized as compared with that of the Colpitts oscillator.

A further modification for FIG. 5 would be to add an inductor between point E and resistor R4 which would improve low frequency noise immunity. This inductor may be chosen to look like a high impedance over the oscillator band and a low reactance at low frequencies. Capacitor C7 may be chosen to look like a high reactance at low noise frequencies. This circuit would short out feedback to the tuned circuit and transistor of low frequency noise and thus prevent such noise from appearing amplified in the output as AM noise or FM modulation of the output.

Figure 6:
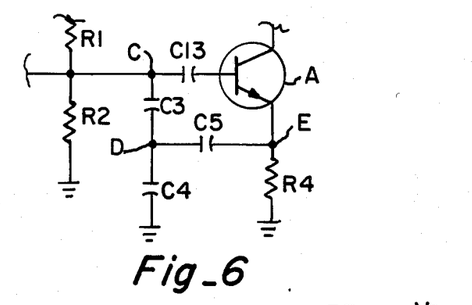
FIG. 6 is a schematic circuit diagram of still another modification of the oscillator shown in FIG. 1.

A further modification shown in FIG. 6 would be to add a capacitor C13 in the feedback loop between the base of the transistor and point C. This added capacitor would similarly be used to maintain proper impedance matching and proper phase relationships.

Figure 7:
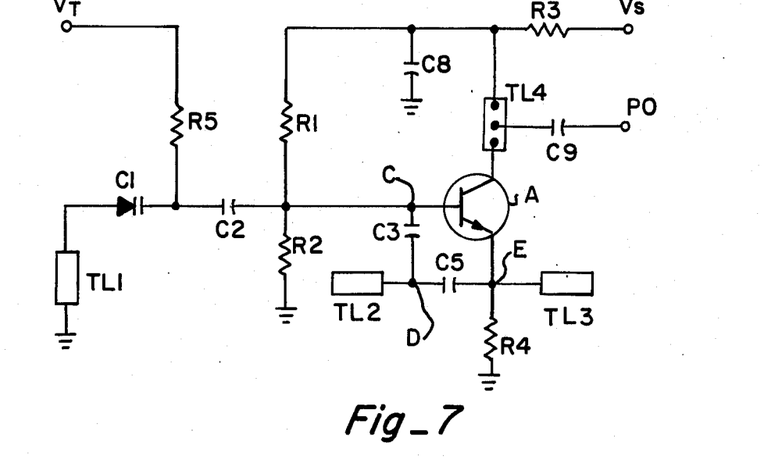
FIG. 7 is a schematic circuit diagram of an oscillator according to the present invention using transmission line sections.

Referring now to FIG. 7, there is shown a transmission line section TL1 in place of inductor L1, a transmission line section TL2 in place of capacitor C4, and a transmission line section TL3 connected to resistor R4, together with a transmission line section TL4 in place of L2. This circuit would operate in the high microwave frequency range.

Figure 8:
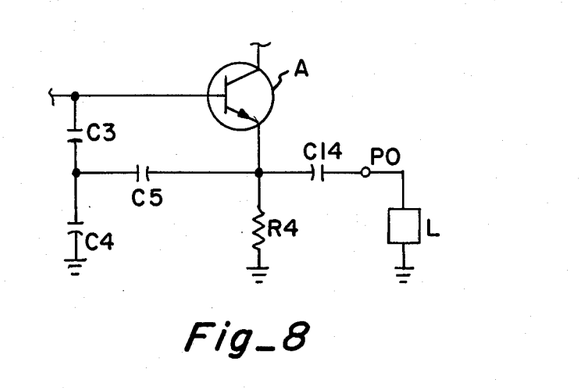
FIG. 8 is an alternative power output for the oscillator of FIG. 1.

An alternative power output circuit, shown in FIG. 8, has the power output terminal coupled to resistor R4 through a coupling capacitor C14.

Figure 9:
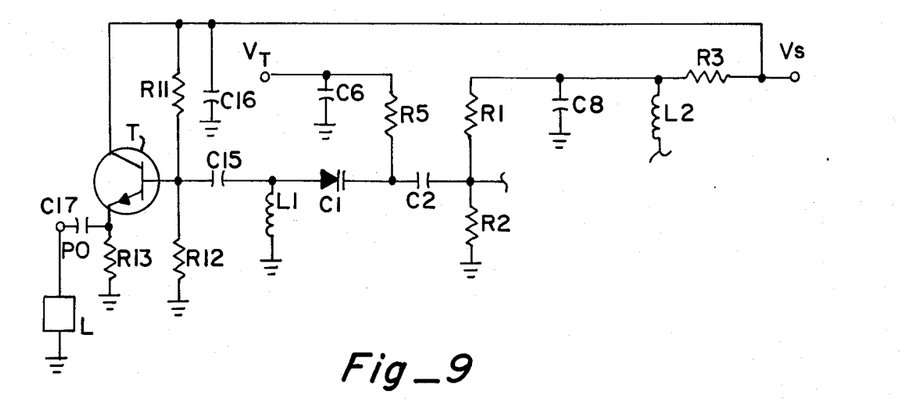
FIG. 9 is another alternative power output for the oscillator of FIG. 1.

Another arrangement for the power output terminal PO, which is shown in FIG. 9, is to have it coupled to inductor L1 of the resonant tank circuit. The coupling shown includes an amplifier circuit which, as shown, is an emitter follower circuit having a transistor T with its base coupled to inductor L1 through capacitor C15. A bias resistor R11 is connected between the base of the transistor and the VS terminal. A bias resistor R12 is connected between the base and ground. Resistor R13 is connected between the emitter and ground. An RF bypass capacitor C16 is connected to resistor R11 and terminal VS. A coupling capacitor C17 is connected between the emitter and output terminal PO. The load L is shown connected across output terminal PO.

Although the present invention has been described with a certain degree of particularity, it is understood that the present disclosure has been made by way of example and that changes in details of structure may be made without departing from the spirit thereof.

What is claimed is:

1. A wideband electronic oscillator having an improved performance at higher frequencies comprising:
   a resonant tank circuit including an inductance means, a main capacitance, and two feedback signal dividing capacitors connected in series with one another for producing oscillations;
   a signal amplifier for overcoming losses to sustain oscillations in the tank circuit, said amplifier having an input and a feedback output, said amplifier being connected in a feedback loop for said tank circuit which includes one of said feedback signal dividing capacitors;
   a first impedance connected between said feedback output and ground; and
   a second impedance including a reactance connected between said feedback signal dividing capacitors and said feedback output for maintaining the phase shift of a feedback signal produced in said feedback loop at the input and output of said amplifier at substantially zero degrees and for reducing noise components near the oscillating frequency, said second impedance having a high value at low frequencies in relation to the first impedance so that the low frequency noise components are dissipated in said first impedance,
   said second impedance reducing the loading of said first impedance on said tank circuit to raise the Q and thereby improve the stability of the oscillations in said tank circuit.

2. An oscillator as set forth in claim 1 wherein said main capacitor is a tuning capacitance and in particular is a varactor diode.

3. An oscillator as set forth in claim 2 including a DC blocking capacitor connected between said varactor diode and said input.

4. An oscillator as set forth in claim 2 including a voltage timing input terminal to supply a positive tuning voltage at a cathode electrode of said varactor diode with respect to an anode electrode of said varactor diode.

5. An oscillator as set forth in claim 1 wherein said amplifier is an active device in the form of a transistor having a base and emitter connected in said feedback loop.

6. An oscillator as set forth in claim 5 wherein said base is connected to said main capacitor and said one dividing capacitor.

7. An oscillator as set forth in claim 5 wherein said emitter is connected to said first impedance.

8. An oscillator as set forth in claim 1 wherein said first impedance is a resistor.

9. An oscillator as set forth in claim 1 including a voltage tuning input terminal to supply a voltage to bias said main capacitor through a resistor.

10. An oscillator as set forth in claim 9 including an RF bypass capacitor connected to said terminal to provide a low pass filter and thereby prevent RF signals from appearing on said terminal.

11. An oscillator as set forth in claim 1 including a power input terminal to supply a DC feed voltage to said amplifier through a resistor.

12. An oscillator as set forth in claim 11 including said resistor, a second resistor, and a third resistor connected to ground to set the operating point of said amplifier.

13. An oscillator as set forth in claim 1 including a power output terminal coupled through an AC output coupling and impedance matching means connected to a power output of said signal amplifier.

14. An oscillator as set forth in claim 13 wherein said coupling and matching means includes a capacitor connected between said amplifier and power output terminal, an inductor coupled to said capacitor and said amplifier power output, and a bypass capacitor connected between said inductor and ground to provide an RF ground.

15. An oscillator as set forth in claim 1 wherein the capacitance of said capacitors in said resonant tank circuit, excluding said main capacitor, is relatively large with respect to the capacitance of said main capacitor so that the resonant frequency of the tank circuit is primarily dependent on the value of said main capacitor.

16. An oscillator as set forth in claim 15 wherein said resonant frequency tuning range is greater than the ratio of 3:1.

17. An oscillator as set forth in claim 1 wherein the value of said second impedance is selected in relation to the size of the other feedback signal dividing capacitor so as to minimize parasitic phase shift and parasitic resonance effects on the feedback signal.

18. An oscillator as set forth in claim 1 wherein said second impedance enables the setting of the gain of said amplifier independently of the capacitance of the dividing capacitors to provide improved power output flatness over the tuning range.

19. An oscillator as set forth in claim 1 wherein said main capacitor includes a first varactor diode and a second varactor diode connected in series with one another, the cathodes of said varactor diodes being connected together and a DC return resistor being connected to the diode of said second varactor diode and to ground.

20. An oscillator as set forth in claim 1 wherein said main capacitor includes a first varactor diode and a second varactor diode connected in series with one another, the cathodes of the varactor diodes being connected together and the anode of the second varactor being connected to ground to increase the tuning range.

21. An oscillator as set forth in claim 1 including a tuned series resonant circuit tuned and ganged to said resonant tank circuit, said tuned series resonant circuit being connected between said second impedance and said feedback signal dividing capacitors.

22. An oscillator as set forth in claim 1 including a capacitor connected across said first resistor impedance to allow for the adjustment of the gain of said amplifier independently of the adjustment of said second impedance.

23. An oscillator as set forth in claim 1 including a capacitor connected to said input and said one capacitor in said feedback loop.

24. An oscillator as set forth in claim 1 wherein said inductor, said other feedback signal dividing capacitor, an element connected to said second impedance and said first impedance, and a second element in the power output of said amplifier are transmission line sections to operate at high microwave frequencies.

25. An oscillator as set forth in claim 1 including a power output terminal coupled to said first impedance.

26. An oscillator as set forth in claim 1 including a power output terminal coupled to said inductor.

27. An oscillator as set forth in claim 26 including a coupling capacitor and an active device connected in an amplifier circuit coupled between said power output terminal and said inductor.

28. A wideband electronic oscillator having an improved tuning range, improved tuning linearity, improved phase noise performance and an improved power output flatness comprising:

a resonant tank circuit including an inductor, a tuning varactor diode, a blocking capacitor and two feedback signal dividing capacitors connected in series with one another for producing oscillations;

a signal amplifier including an active device with three electrodes and an input and a feedback output at two of said three electrodes, said amplifier overcoming losses to sustain oscillations in the tank circuit, said amplifier being connected in a feedback loop for said tank circuit which includes one of said feedback signal dividing capacitors;

a first impedance connected between said feedback output and ground; and a capacitor connected between said feedback signal dividing capacitors and said feedback output for maintaining the phase shift of a feedback signal produced in said feedback loop at the input and output of said amplifier at substantially zero degrees and for reducing noise components near the oscillating frequency, said capacitor having a high impedance value at low frequencies in relation to the first impedance so that the low frequency noise components are dissipated in said first impedance, said second impedance reducing the loading of said first impedance on said tank circuit to raise the Q and thereby improve the stability of the oscillations in said tank circuit.

29. An oscillator as set forth in claim 21 wherein said active device is a transistor having the base and emitter connected in said feedback loop.

* * * * *

UNITED STATES PATENT AND TRADEMARK OFFICE
CERTIFICATE OF CORRECTION

PATENT NO. : 4,621,241
DATED : November 4, 1986
INVENTOR(S) : Joseph H. Kiser

It is certified that error appears in the above–identified patent and that said Letters Patent are hereby corrected as shown below:

Col. 3 lines 35-38 and Col. 5 lines 58-62 the equation should appear as follows:

$$F = \frac{1}{2\pi \sqrt{L \times C \text{ total}}}$$

Col. 4 line 40 the equation should appear as follows:

$$CT \text{ minimum} \simeq C1 \text{ minimum}$$

Signed and Sealed this

Seventeenth Day of February, 1987

Attest:

DONALD J. QUIGG

Attesting Officer     Commissioner of Patents and Trademarks